United States Patent
Campbell et al.

(10) Patent No.: US 9,282,675 B2
(45) Date of Patent: Mar. 8, 2016

(54) THERMAL EXPANSION-ENHANCED HEAT SINK FOR AN ELECTRONIC ASSEMBLY

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Poughkeepsie, NY (US); Madhusudan K. Iyengar, Foster City, CA (US); Robert E. Simons, Poughkeepsie, NY (US); Prabjit Singh, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 211 days.

(21) Appl. No.: 14/063,162

(22) Filed: Oct. 25, 2013

(65) Prior Publication Data

US 2014/0047702 A1 Feb. 20, 2014

Related U.S. Application Data

(62) Division of application No. 13/271,268, filed on Oct. 12, 2011, now Pat. No. 8,743,545.

(51) Int. Cl.
*G06F 1/20* (2006.01)
*H05K 5/00* (2006.01)
(Continued)

(52) U.S. Cl.
CPC ............... *H05K 7/20* (2013.01); *H01L 23/367* (2013.01); *H01L 23/4006* (2013.01);
(Continued)

(58) Field of Classification Search
CPC ............ H05K 7/20; B21D 53/02; F28F 7/00; H01L 23/02; H01L 23/373; H01L 23/367
USPC ............... 361/679.47, 679.54, 697, 702, 709, 361/710; 165/80.2, 104.21, 185; 29/592.1, 29/890.03
See application file for complete search history.

(56) References Cited

U.S. PATENT DOCUMENTS

| 3,887,001 A | 6/1975 | Bickerdike et al. |
| 5,151,777 A | 9/1992 | Akin et al. |

(Continued)

OTHER PUBLICATIONS

Campbell et al., Notice of Allowance for U.S. Appl. No. 13/692,196, filed Dec. 3, 2012 (U.S. Patent Publication No. 2013/0091693 A1), dated Dec. 26, 2013 (8 pages).

(Continued)

*Primary Examiner* — Courtney Smith
*Assistant Examiner* — Zhengfu Feng
(74) *Attorney, Agent, or Firm* — Steven Chiu, Esq.; Kevin P. Radigan, Esq.; Heslin Rothenberg Farley & Mesiti P.C.

(57) ABSTRACT

A heat sink and method of fabrication are provided for removing heat from an electronic component(s). The heat sink includes a heat sink base and frame. The base has a first coefficient of thermal expansion (CTE), and includes a base surface configured to couple to the electronic component to facilitate removal of heat. The frame has a second CTE, and is configured to constrain the base surface in opposing relation to the electronic component, wherein the first CTE is greater than the second CTE. At least one of the heat sink base or frame is configured so that heating of the heat sink base results in a compressive force at the base surface of the heat sink base towards the electronic component that facilitates heat transfer from the electronic component. A thermal interface material is disposed between the base surface and the electronic component.

10 Claims, 5 Drawing Sheets

(51) Int. Cl.
*H05K 7/20* (2006.01)
*F28F 7/00* (2006.01)
*F28D 15/00* (2006.01)
*H01L 23/40* (2006.01)
*H01L 23/427* (2006.01)
*H01L 23/473* (2006.01)
*H01L 23/367* (2006.01)

(52) U.S. Cl.
CPC ........... *H01L 23/427* (2013.01); *H01L 23/473* (2013.01); *H01L 2023/4087* (2013.01); *H01L 2224/16* (2013.01); *Y10T 29/49002* (2015.01); *Y10T 29/4935* (2015.01); *Y10T 29/49353* (2015.01)

(56) References Cited

U.S. PATENT DOCUMENTS

| | | | |
|---|---|---|---|
| 5,256,902 A * | 10/1993 | Culver | 257/722 |
| 5,421,402 A | 6/1995 | Lin | |
| 5,966,290 A | 10/1999 | Sammakia et al. | |
| 6,219,238 B1 | 4/2001 | Andros et al. | |
| 6,809,929 B2 | 10/2004 | Liu | |
| 6,940,712 B2 | 9/2005 | Chu et al. | |
| 7,968,987 B2 | 6/2011 | Kuczynski | |
| 8,067,824 B2 | 11/2011 | Kwon et al. | |
| 2002/0036890 A1 * | 3/2002 | Furuya | 361/702 |
| 2004/0075982 A1 | 4/2004 | Kim et al. | |
| 2005/0072334 A1 | 4/2005 | Czubarow et al. | |
| 2005/0286234 A1 * | 12/2005 | Campbell et al. | 361/719 |
| 2013/0091693 A1 | 4/2013 | Campbell et al. | |
| 2013/0094145 A1 | 4/2013 | Campbell et al. | |

OTHER PUBLICATIONS

Campbell et al., Notice of Allowance for U.S. Appl. No. 13/271,268, filed Oct. 12, 2011 (U.S. Patent Publication No. 203/0094145 Al), dated Jan. 16, 2014 (9 pages).

Campbell et al., Office Action for U.S. Appl. No. 13/271,268, filed Oct. 12, 2011 (U.S. Patent Publication No. 2013/0094145 Al), dated Jul. 3, 2013 (25 pages).

Campbell et al., Office Action for U.S. Appl. No. 13/692,196, filed Dec. 3, 2012 (U.S. Patent Publication No. 2013/0091693 Al), dated Jul. 18, 2013 (17 pages).

* cited by examiner

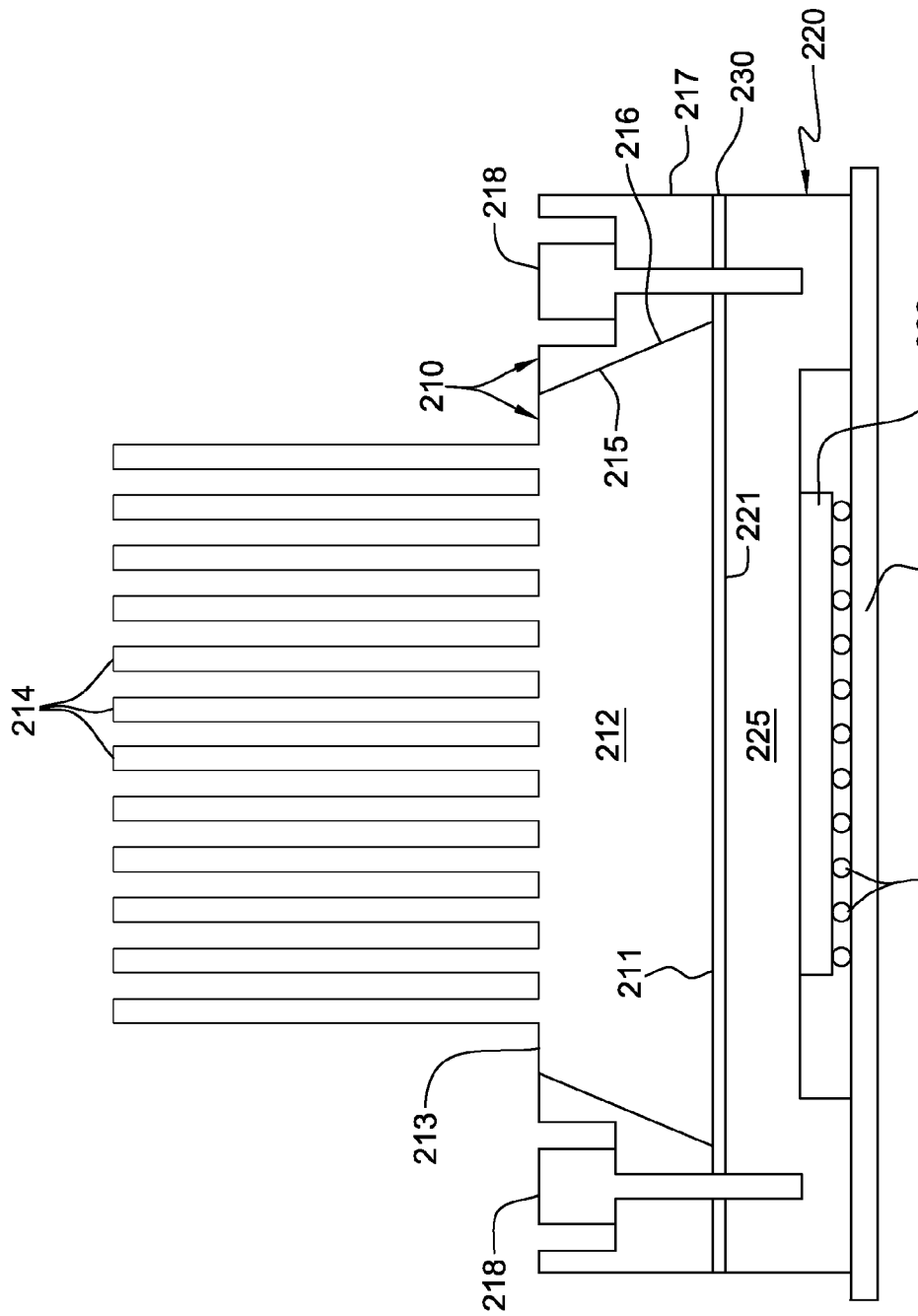

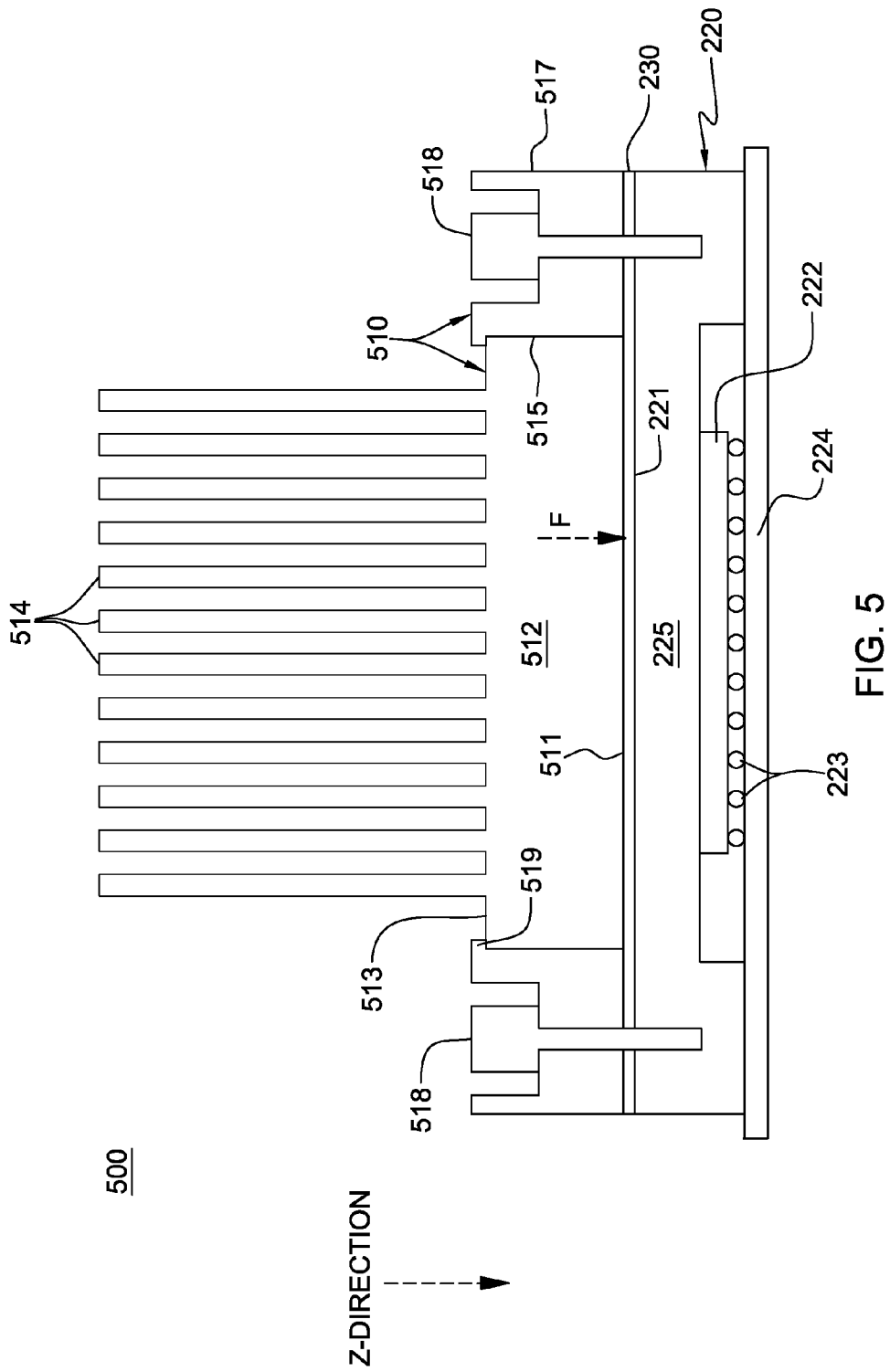

THERMAL EXPANSION-ENHANCED HEAT SINK FOR AN ELECTRONIC ASSEMBLY

CROSS-REFERENCE TO RELATED APPLICATIONS

This application is a divisional application of U.S. application Ser. No. 13/692,196, filed Dec. 3, 2012, and entitled "THERMAL EXPANSION-ENHANCED HEAT SINK FOR AN ELECTRONIC ASSEMBLY", which published Apr. 18, 2013, as U.S. Patent Publication No. 2013/0091693 A1, and which claims priority to U.S. application Ser. No. 13/271,268, filed Oct. 12, 2011, entitled "THERMAL EXPANSION-ENHANCED HEAT SINK FOR AN ELECTRONIC ASSEMBLY", which published Apr. 18, 2013, as U.S. Patent Publication No. 2013-0094145 A1, and each of which are hereby incorporated herein by reference in their entirety.

BACKGROUND

Operating electronic components or devices produce heat. This heat should be removed from the devices in order to maintain device junction temperatures within desirable limits, with failure to remove produced heat resulting in increased device temperature, potentially leading to thermal runaway conditions. Several trends in the electronics industry have combined to increase the importance of thermal management, including heat removal from electronic components, including technologies where thermal management has traditionally been less of a concern, such as CMOS. In particular, the need for faster and more densely packed circuits has had a direct impact on the importance of thermal management. For example, power dissipation, and therefore heat production, increases as device operating frequencies increase. Also, increased operating frequencies may be possible at lower device junction temperatures. In addition, as more and more devices are packed onto a single chip, power density (Watts/$cm^2$) increases, resulting in the need to remove more heat from a given size chip or module.

Existing cooling technologies typically utilize air or water to carry heat away from an electronic component, and reject the heat. Heat sinks with heat pipes or vapor chambers are commonly used in air-cooled devices, while cold plates are most prominent in water-cooled structures. However, with both types of cooling assemblies, it is necessary to attach the cooling assembly to the heat-generating electronic component or device. This attachment results in a thermal interface resistance between the cooling structure or assembly and the electronic component. One aspect limiting the capability to cool a given electronic component is the thermal interface between the component to be cooled and the cooling structure.

BRIEF SUMMARY

In one aspect, a method of fabricating a thermal expansion-enhanced heat sink is provided. The method includes: providing a heat sink base comprising a base surface configured to couple to a surface of a heat-generating electronic component to facilitate removal of heat from the heat-generating electronic component, the heat sink base having a first coefficient of thermal expansion; providing a frame configured to couple to the heat-generating electronic component and constrain the base surface of the heat sink base in opposing relation to the surface of the heat-generating electronic component, the frame having a second coefficient of thermal expansion, wherein the first coefficient of thermal expansion of the heat sink base is greater than the second coefficient of thermal expansion of the frame, and wherein at least one of the heat sink base or the frame is configured so that heating of the heat sink base expands the heat sink base relative to the frame and results in a force component at the base surface of the heat sink base towards the surface of the heat-generating electronic component that facilitates heat transfer from the surface of the heat-generating electronic component to the heat sink base; and providing a liquid-cooled cold plate coupled to the heat sink base for removing heat from the heat sink base.

In a further aspect, a method of fabricating a thermal expansion-enhanced heat sink is provided. The method includes: providing a heat sink base comprising a base surface configured to couple to a surface of heat-generating electronic component to facilitate removal of heat from the heat-generating electronic component, the heat sink base having a first coefficient of thermal expansion; providing a frame configured to couple to the heat-generating electronic component and constrain the base surface of the heat sink base in opposing relation to the surface of the heat-generating electronic component, the frame having a second coefficient of thermal expansion, wherein the first coefficient of thermal expansion of the heat sink base is greater than the second coefficient of thermal expansion of the frame, and wherein at least one of the heat sink base or the frame is configured so that heating of the heat sink base expands the heat sink base relative to the frame and results in a force component at the base surface of the heat sink base towards the surface of the heat-generating electronic component that facilitates heat transfer from the surface of the heat-generating electronic component to the heat sink base; and wherein the heat sink base comprises a cylindrical side surface, and a frame comprises a cylindrical sheath with a top edge configured to engage the heat sink base, and wherein a gap exists between the cylindrical side surface of the heat sink base and the cylindrical sheath of the frame when the heat sink base is unheated, and heating of the heat sink base causes the heat sink base to expand uniformly in the Z-direction, thereby producing the force component at the base surface of the heat sink base towards the surface of the heat-generating electronic component that facilitates heat transfer from the surface of the heat-generating electronic component to the heat sink base.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 2 is a cross-sectional elevational view of one embodiment of an electronic assembly comprising a thermal expansion-enhanced heat sink coupled to a heat-generating electronic component, in accordance with one or more aspects of the present invention;

FIG. 5 is a cross-sectional elevational view of another embodiment of an electronic assembly comprising a thermal expansion-enhanced heat sink coupled to a heat-generating electronic component, in accordance with one or more aspects of the present invention.

DETAILED DESCRIPTION

As used herein, "electronic component" comprises any heat-generating component of, for example, a computer system or other electronic unit requiring cooling. The term includes, for example, one or more integrated circuit chips, devices or modules, either with or without a thermal module cap or thermal spreader.

Reference is made below to the drawings, which are not drawn to scale for ease of understanding, wherein the same reference numbers used throughout different figures designate the same or similar components.

Figure 1A:
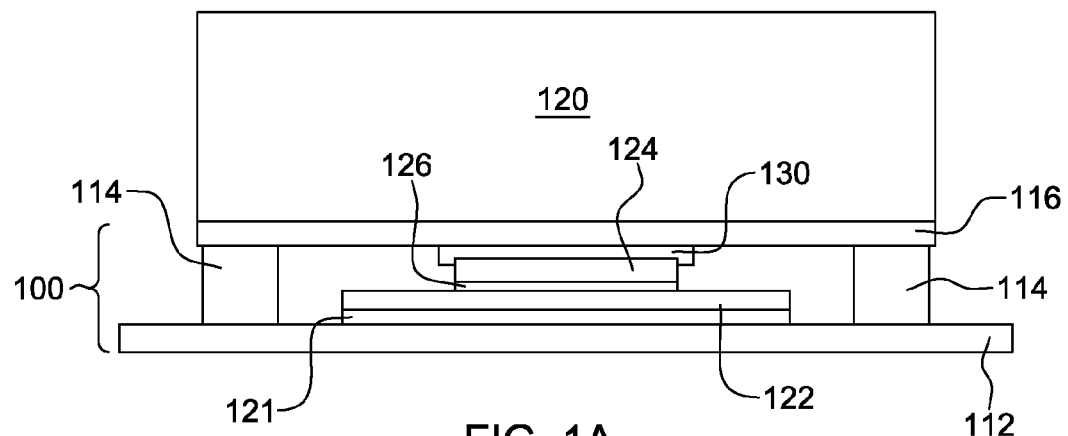
FIG. 1A depicts one embodiment of an electronic assembly wherein thermal grease is employed to couple an electronic component to a cooling assembly.

A thermal grease or an epoxy may be employed as a thermal interface material within an electronic assembly. FIG. 1A depicts one embodiment of an electronic assembly, generally denoted 100, wherein a cooling assembly 120, such as a heat sink with a heat pipe or vapor chamber, is coupled to an electronic module 110. Module 110 includes a printed circuit board 112, side walls 114, and lid or cap 116, within which an integrated circuit chip 124 is packaged. Integrated circuit chip 124 connects (in one example) via a flip chip interface 126 with a substrate 122, and a Ball Grid Array (BGA) 121 is employed to electrically connect substrate 122 to printed circuit board 112. A thermal grease 130 is employed to thermally couple integrated circuit chip 124 to lid 116, and hence to cooling assembly 120.

Figure 1B:
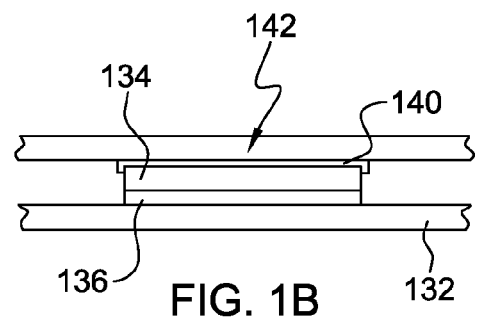
FIG. 1B is a partial embodiment of another electronic assembly wherein an advanced epoxy interface is employed to couple an electronic component to a lid of the electronic assembly.

FIG. 1B depicts a partial embodiment of an electronic assembly wherein an advanced epoxy interface 140 is used to couple an integrated circuit chip 134 to a lid 142, which comprises part of or couples to a cooling assembly (not shown). The integrated circuit chip 134 can electrically connect to a substrate 132 via conventional flip chip interface technology 136.

The heat transfer performance of the thermal grease of FIG. 1A and the epoxy of FIG. 1B is directly proportional to the thermal conductivity of the material employed, and is inversely proportional to the interface thickness, which is also known as the bond line thickness. Thermal grease interfaces typically have higher thermal conductivity, but also exhibits a thicker bond line, while epoxies typically have a lower thermal conductivity, but the joints can be manufactured with thinner bond lines. In general, thermal greases show relatively low thermal performance, but yield more under stress, while these characteristics are reversed for an epoxy interface. Also, to achieve very small interface thicknesses using an epoxy, while minimizing stresses, it is typically necessary to bond the electrical component (e.g., integrated circuit chip) to a material that has a thermal expansion coefficient very similar to that of silicon.

Thermal performance of the electronic assembly can be further enhanced by providing an interface between the electronic component and the cooling structure, alternatively referred to herein as a heat sink. Thermal performance of such an interface can be enhanced by introducing pressure to couple the cooling structure and the electronic component to be cooled, for example, using a clamping mechanism or fasteners, as well as an intermediary substance, generally referred to herein as a thermal interface material (TIM) to fill the resulting gaps created by fine machining marks and the material's crystal structure. Further advantage can be obtained by utilizing the inherent differences in thermal expansion of different materials with different coefficients of thermal expansion (CTE), and the fact that in operation, there will exist a significant temperature gradient from the electronic component to be cooled to the cooling structure (or assembly).

Advantageously, disclosed herein are heat sinks or cooling structures that take advantage of a thermal expansion coefficient mismatch between different materials of the heat sink to increase the pressure of contact between the heat sink and the surface of the electronic component to be cooled, and therefore reduce the thermal resistance of the interface as the temperature of the electronic component increases during operation.

Figure 3:
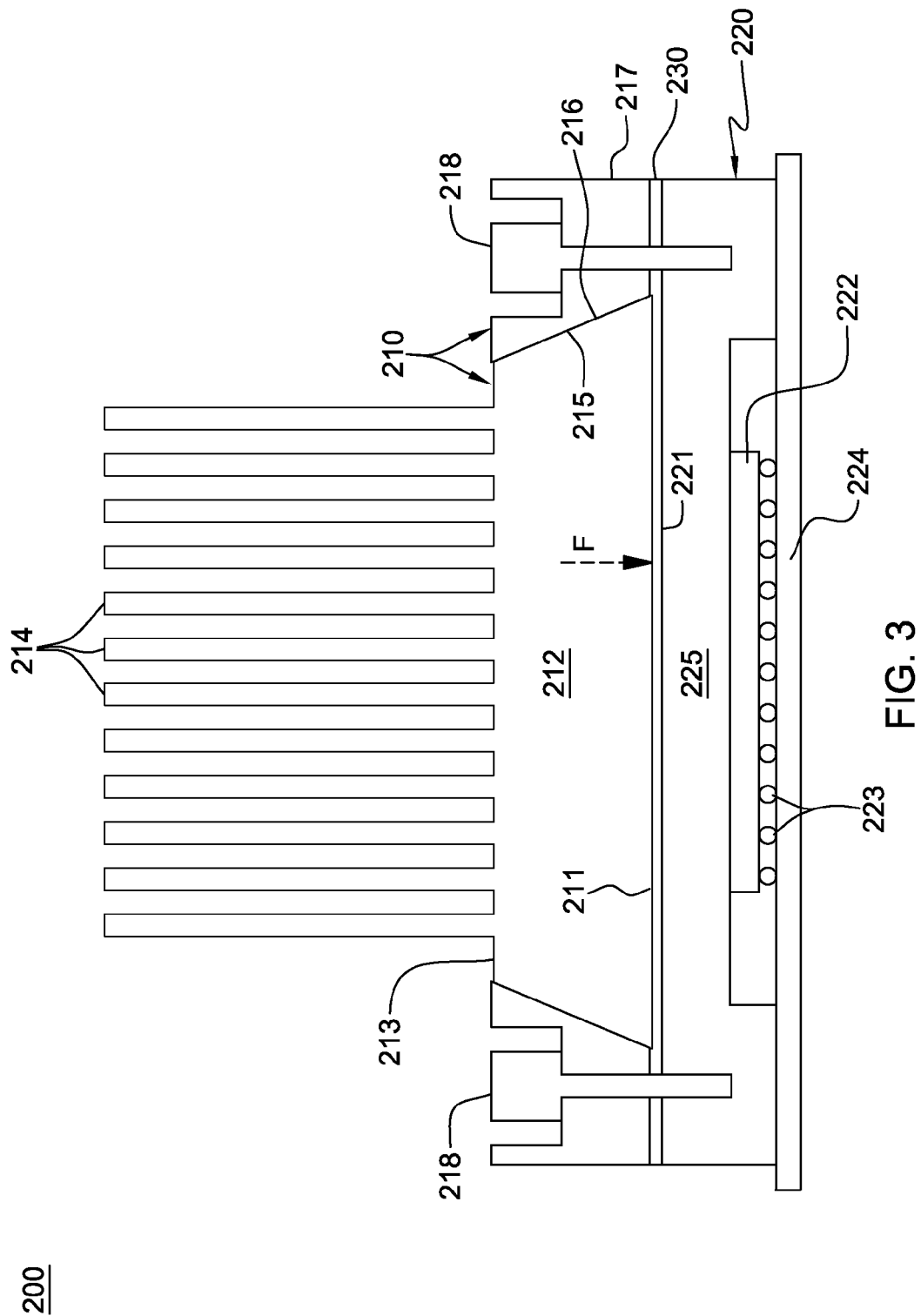
FIG. 3 is a cross-sectional elevational view of the electronic assembly of FIG. 2, with the higher coefficient of thermal expansion (CTE) heat sink base shown expanded relative to the frame to apply a compressive loading force (F) to the thermal interface material between the base surface of the heat sink base and the electronic component to be cooled, in accordance with one or more aspects of the present invention.

FIGS. 2 & 3 illustrate one embodiment of an electronic assembly 200 comprising one or more heat-generating electronic components 220, and a thermal expansion-enhanced heat sink 210 coupled to a surface 221 of, in this embodiment, electronic component 220. Electronic component 220 is, by way of example, an electronic module comprising an integrated circuit chip 222 which is electrically connected 223 to a substrate 224, which itself may be connected to a printed circuit board (not shown). The electronic module further includes a cap (or lid) 225 which is coupled to substrate 224 and encloses integrated circuit chip 222. Thermal expansion-enhanced heat sink 210 is shown coupled via securing mechanisms 218 to cap 225 of electronic component 220, with a base surface 211 of heat sink base 212 of thermal expansion-enhanced heat sink 210 disposed in opposing relation to surface 221 of electronic component 220 to be cooled. As shown, a thermal interface material 230 is provided between base surface 211 of heat sink base 212 and surface 221 of electronic component 220 to enhance heat transfer performance from the electronic component 220 to the heat sink base 212. Heat sink base 212 further includes an upper surface 213 disposed parallel to base surface 211, from which a plurality of air-cooled fins 214 extend (in one embodiment) as shown. In this embodiment, heat sink base 212 also comprises an angled side surface 215 sloping inward from base surface 211 to upper surface 213.

The thermal expansion-enhanced heat sink 210 further includes a frame 217, which is configured to the heat-generating electronic component 220, and which partially encircles and constrains the heat sink base to maintain base surface 211 of heat sink base 212 in opposing relation to surface 221 of heat-generating electronic component 220. Frame 217 further includes an angled inner surface 216 in opposing relation to and (in one embodiment) in contact with angled side surface 215 of heat sink base 212.

In accordance with one or more aspects of the present invention, heat sink base 212 and frame 217 are fabricated of different materials with different coefficients of thermal expansion (CTE), wherein heat sink base 212 has a higher CTE than the material of frame 217. In operation, heat is transferred across thermal interface 230 from electronic component 220 into heat sink base 212. With heating of heat sink base 212, the heat sink base expands, forcing angled side surface 215 of heat sink base 212 against angled inner surface 216 of frame 217. This in turn results in a force component (F) as shown in FIG. 3, which forces base surface 211 of heat sink base 212 towards surface 221 of heat-generating electronic component 220, to facilitate heat transfer from the surface 221 of heat-generating electronic component 220 to heat sink base 212. For example, heating of heat sink base 212 increases compressive loading on thermal interface material 230 disposed between base surface 211 of heat sink base 212 and surface 221 of electronic component 220, which facilitates heat transfer from the surface of the heat-generating electronic component to the heat sink base through the thermal interface material. In FIG. 3, heat sink base 212 is shown shifted slightly towards surface 221 of electronic component 220 to illustrate this compressive force (F) being applied to thermal interface material 230 between surfaces 211, 221.

As one specific example, thermal expansion-enhanced heat sink 210 is a bi-metallic, air-cooled fin heat sink. Heat sink base 212 may be fabricated of a conductive metal with a high thermal coefficient of expansion, such as copper, while frame 217 may be fabricated of a lower CTE alloy, such as steel. In one embodiment, in the as-fabricated condition, the base surface of the heat sink base is co-planar with the corresponding surface of the frame 217, as shown in FIG. 2. In operation, the electronic component produces heat, and the heat sink temperature rises, with the heat sink base material expanding more than the frame material. The heat sink base 212 wants to expand more at the base surface than at the upper surface because the heat sink base dimensions are larger at the base surface than at the upper surface. The differential expansion of the heat sink base results in a tendency for the heat sink base thermal interface to become convex. However, since the heat sink base is coupled through the frame to the cap of the electronic component, the tendency of the heat sink base to become convex translates into an increased pressure between the heat sink base and the cap of the electronic component. Increased contact pressure results in a decreased interface thermal resistance across thermal interface material 230. Thus, the thermal performance of the thermal expansion-enhanced heat sink is improved by fitting, for example, a heat sink base 212 fabricated of copper into a metal frame 217 fabricated of steel. The shape of the steel ring is such that the heat sink base does not slip out of the ring, and provides enough differential expansion for heat sink base 212 to tend to become convex when heated.

Note that if the heat sink base were fabricated of multiple layers of metals of differing thermal coefficients of expansion, the tendency to become convex when heated can still be achieved, but at an expense of reduced thermal conductivity through the heat sink base. The reason for this is that the metal mated to, for example, copper, will have a lower thermal coefficient of expansion than copper only. Additional materials for frame 217 include molybdenum and aluminum-silicon carbide. Example thermal interface materials include compliant-cured materials (such as certain pastes available from Shin Etsu Chemical, Co., Ltd., of Tokyo, Japan), an interface pad (such as available from Parker Hannifin Corporation, of Woburn, Mass., USA, or GrafTech International, of Lakewood, Ohio, USA), or indium-based structures, (including indium variants, such as patterned indium, aluminized indium, etc.).

Figure 4:
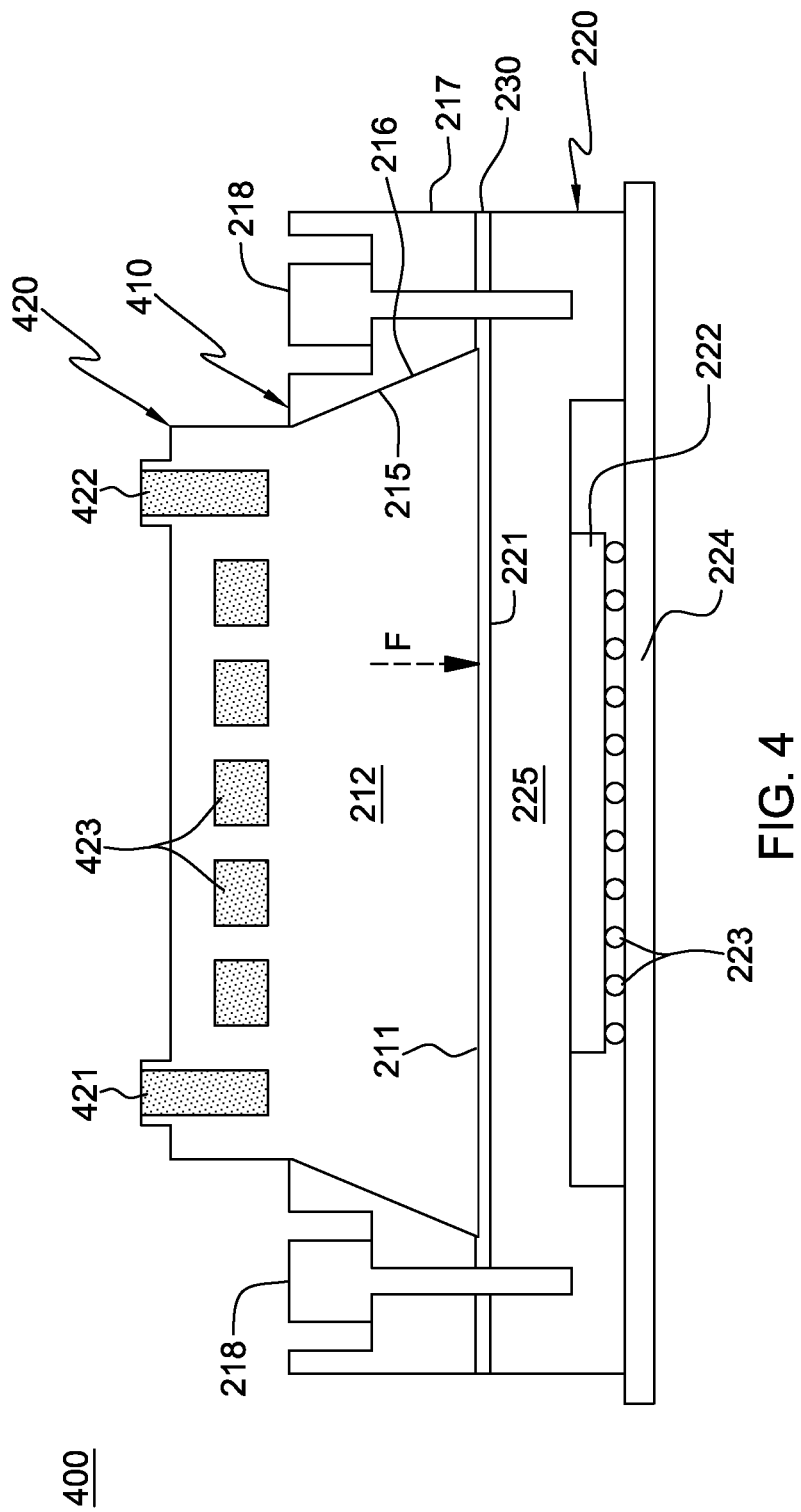
FIG. 4 is a cross-sectional elevational view of an alternate embodiment of an electronic assembly comprising a thermal expansion-enhanced heat sink coupled to a heat-generating electronic component, in accordance with one or more aspects of the present invention.

FIG. 4 depicts an alternate embodiment of an electronic assembly 400, in accordance with one or more aspects of the present invention. Electronic assembly 400 is similar to electronic assembly 200 described above in connection with FIGS. 2 & 3. However, in the embodiment of FIG. 4, electronic assembly 400 includes a thermal expansion-enhanced heat sink 410 which comprises a heat sink base 212, such as described above, as well as a liquid-cooled cold plate 420 integrated with heat sink base 212. The liquid-cooled cold plate 420 facilitates removal of heat from heat sink base 212 to liquid coolant passing through liquid-cooled cold plate 420. In the embodiment illustrated, liquid-cooled cold plate 420 includes a coolant inlet 421 and a coolant outlet 422 in fluid communication with one or more coolant-carrying channels 423. Otherwise, the operation of thermal expansion-enhanced heat sink 410, and in particular heat sink base 212, is similar to that described above in connection with thermal expansion-enhanced heat sink 210 of electronic assembly 200 depicted in FIGS. 2 & 3.

As illustrated, thermal expansion-enhanced heat sink 410 is coupled via securing means 218 to, for example, cap 225 of electronic component 220, which is shown to include integrated circuit chip 222 in electrical contact 223 with a substrate 224 (by way of example only). A compressive force (F) is produced (with heating of heat sink base 212 from operation of electronic component 220) between base surface 211 and surface 221 of electronic component 220. This compressive force (F) is a loading force on the thermal interface which enhances the heat transfer performance of thermal interface material 220 in the region between base surface 211 and surface 221 of electronic component 220, as explained above.

FIG. 5 depicts another embodiment of an electronic assembly 500, in accordance with one or more aspects of the present invention. In this embodiment, electronic assembly 500 is shown to comprise a thermal expansion-enhanced heat sink 510 and an electronic component 220. Electronic component 220 includes integrated circuit chip 222 electrically connected 223 to a substrate 224. The integrated circuit chip 222 is enclosed via a cap 225 secured (in this example) to substrate 224. Thermal expansion-enhanced heat sink 510 is secured to the cap 225 (in one embodiment) via securing mechanisms 518.

In the embodiment depicted, thermal expansion-enhanced heat sink 510 comprises a heat sink base 512, which comprises a cylindrical side surface 515, a base surface 511 and an upper surface 513. A plurality of air-cooled, thermally conductive fins 514 extend from upper surface 513, and base surface 511 is shown disposed in opposing relation to surface 221 of electronic component 220 to be cooled. Thermal interface material 230 is provided between thermal expansion-enhanced heat sink 510 and surface 221 of electronic component 220. In the illustrated embodiment, frame 517 comprises a cylindrical sheath with a top edge or lip 519 that engages upper surface 513 of heat sink base 512 and holds heat sink base 512 in position within the thermal expansion-enhanced heat sink at the upper surface thereof. Frame 517 is constructed, in one embodiment, such that there is a gap between heat sink base 512 and the cylindrical sheath of the frame 517 when the heat sink base is unheated. Heating of heat sink base 512 causes the heat sink base to expand uniformly in the Z-direction, thereby forcing (F) base surface 511 of heat sink base 512 towards surface 221 of heat-generating electronic component 220 to facilitate heat transfer from surface 221 to heat sink base 512 through the compressively loaded thermal interface 230 disposed between base surface 511 and surface 221. Note in this regard that top lip 519 of frame 517 prevents heat sink base 512 from expanding in the Z-direction outward away from electronic component 220.

In this alternate design, the heat sink base and frame comprise straight wall, cylindrical surfaces disposed in opposing relation. Heat sink base 512 is fabricated, in one embodiment, as a thermally conductive, metal-cylindrical core, with a high CTE, which makes contact with the surface 221 of electronic component 220 at its base surface (e.g., across the thermal interface material 230), and includes air-cooled, thermally conductive fins at its upper surface. The structure is surrounded by a cylindrical sheath, fabricated of a different material, which has a lower CTE, and which includes a lip (or partial cover) on the top edge that holds heat sink base 512 in place within the thermal expansion-enhanced heat sink. The edges of the core and the sheath are vertical, with a small gap allowing for free expansion in the radial direction. When the heat sink structure is cold, there is no gap between the upper surface 513 of heat sink base 512 and the lip 519 of frame 517. As the integrated circuit chip 222 operates and heats electronic component 220, the heat sink base 512 heats and expands. Since the vertical height is uniform, it expands uniformly in the Z-direction, but because it is bound at the upper surface 513, the heat sink base 512 instead compresses uniformly on the thermal interface material 230 between base surface 511 and surface 221 of electronic component 220. This in turn reduces the bond line thickness and reduces the thermal interface resistance. Due to the uniform compression this implementation generates, it uses (in one embodiment) a softer (and more flowable) thermal interface material which can easily flow in and out of the space between base surface 511 and surface 221.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method of fabricating a heat sink assembly comprising:

providing a heat sink base comprising a base surface to couple to a surface of a heat-generating electronic component to facilitate removal of heat from the heat-generating electronic component, the heat sink base having a first coefficient of thermal expansion, and including at least one coolant-carrying channel within the heat sink base to facilitate, removal of heat from the heat sink base; and providing a heat sink frame to couple to the heat-generating electronic component and constrain the base surface of the heat sink base in opposing relation to the surface of the heat-generating electronic component, the heat sink frame having a second coefficient of thermal expansion, wherein the first coefficient of thermal expansion of the heat sink base is greater than the second coefficient of thermal expansion of the heat sink frame, and wherein the heat sink base includes a side surface facing an inner surface of the heat sink frame and wherein heating of the heat sink base expands the heat sink base relative to the heat sink frame forcing the side surface of the heat sink base to move against the inner surface of the heat sink frame, thereby producing a resultant force component at the base surface of the heat sink base towards the surface of the heat-generating electronic component that facilitates heat transfer from the surface of the heat-generating electronic component to the heat sink base.

2. The method of claim 1, further comprising providing thermal interface material disposed between the base surface of the heat sink base and the surface of the heat-generating electronic component, wherein heating of the heat sink base increases compressive loading on the thermal interface material disposed between the base surface of the heat sink base and the surface of the heat-generating electronic component, which facilitates heat transfer from the surface of the heat-generating electronic component to the heat sink base across the thermal interface material.

3. The method of claim 1, wherein providing the heat sink base comprises providing the heat sink base with an angled side surface sloping inward from the base surface of the heat sink base, the side surface of the heat sink base being the angled side surface of the heat sink base; and wherein providing the heat sink frame comprises providing the heat sink frame with an angled inner surface in opposing relation to the angled side surface of the heat sink base, the inner surface of the heat sink frame being the angled inner surface of the heat sink frame, and wherein heating of the heat sink base expands the heat sink base, forcing the angled side surface of the heat sink base against the angled inner surface of the heat sink frame, and thereby producing the force component at the base surface of the heat sink base towards the surface of the heat-generating electronic component that facilitates heat transfer from the surface of the heat-generating electronic component to the heat sink base.

4. The method of claim 3, wherein the heat-generating electronic component further comprises a module cap, and the heat sink frame is affixed to the module cap of the heat-generating electronic component, and wherein the heat sink frame encircles the heat sink base.

5. The method of claim I, wherein the heat sink base comprises copper, and the heat sink frame comprises at least one of steel, molybdenum or aluminum-silicon carbide.

6. A method of fabricating a heat sink assembly comprising:

providing a heat sink base comprising a base surface to couple to a surface of a heat-generating electronic component to facilitate removal of heat from the heat-generating electronic component, the heat sink base having a first coefficient of thermal expansion;

providing a heat sink frame to couple to the heat-generating electronic component and constrain the base surface of the heat sink base in opposing relation to the surface of the heat-generating electronic component, the heat sink frame having a second coefficient of thermal expansion, wherein the first coefficient of thermal expansion of the heat sink base is greater than the second coefficient of thermal expansion of the frame, and wherein heating of the heat sink base expands the heat sink base relative to the heat sink frame and results in a force component at the base surface of the heat sink base towards the surface of the heat-generating electronic component that facilitates heat transfer from the surface of the heat-generating electronic component to the heat sink base; and wherein the heat sink base comprises a cylindrical side surface, and the heat sink frame comprises a cylindrical sheath with a top edge configured to engage the heat sink base, and wherein a gap exists between the cylindrical side surface of the heat sink base and the cylindrical sheath of the heat sink frame when the heat sink base is unheated, and heating of the heat sink base causes the heat sink base to expand uniformly in the Z-direction, thereby producing the force component at the base surface of the heat sink base towards the surface of the heat-generating electronic component that facilitates heat transfer from the surface of the heat-generating electronic component to the heat sink base.

7. The method of claim 6, further comprising coupling the heat sink assembly to the heat-generating electronic component and providing a thermal interface material disposed between the base surface of the heat sink base and the surface of the heat-generating electronic component, wherein heating of the heat sink base increases compressive loading on the thermal interface material disposed between the base surface of the heat sink base and the surface of the heat-generating electronic component, which facilitates heat transfer from the surface of the heat-generating electronic component to the heat sink base across the thermal interface material.

8. The method of claim 6, further comprising providing a plurality or air-cooled fins extending from the heat sink base for removing heat from the heat sink base.

9. The method of claim 6, further comprising providing at least one coolant-carrying channel within the heat sink base for removing heat from the heat sink base.

10. The method of claim 6, wherein the heat sink base comprises copper, and the heat sink frame comprises at least one of steel, molybdenum or aluminum-silicon carbide.

* * * * *